United States Patent [19]

Matsuo et al.

[11] Patent Number: 5,019,860
[45] Date of Patent: May 28, 1991

[54] APPARATUS FOR IMAGE FORMATION AND METHOD OF IMAGE FORMATION

[75] Inventors: Masaaki Matsuo, Tokyo; Toshio Shimada; Seishiro Hamada, both of Hiroshima, all of Japan

[73] Assignee: Toyo Ink Manufacturing Co., Ltd., Tokyo, Japan

[21] Appl. No.: 371,972

[22] Filed: Jun. 27, 1989

[30] Foreign Application Priority Data

Jul. 4, 1988 [JP] Japan ................................ 63-164984
Jul. 4, 1988 [JP] Japan ................................ 63-164985
Jul. 4, 1988 [JP] Japan ................................ 63-164986

[51] Int. Cl.$^5$ ............................................. G03B 27/22
[52] U.S. Cl. ...................................... 355/104; 355/79; 355/85; 355/106
[58] Field of Search ....................... 355/78, 79, 85, 104, 355/106, 107, 110

[56] References Cited

U.S. PATENT DOCUMENTS

4,298,278 11/1981 Katakura et al. ...................... 355/85
4,637,710 1/1987 Fujii et al. ............................ 355/110
4,637,711 1/1987 Fujisawa et al. ...................... 355/110

Primary Examiner—Monroe H. Hayes
Attorney, Agent, or Firm—Wenderoth, Lind & Ponack

[57] ABSTRACT

An apparatus for forming a transfer image comprising at least a light source for exposure, an exposure cylinder and a second cylinder which can contact the exposure cylinder, wherein the light source for the exposure is arranged outside the radius of the exposure cylinder, the exposure cylinder has means of attaching an image-forming material thereto, and the second cylinder has means of receiving the image-forming material from the surface of the exposure cylinder and holds the received image-forming material, and a method of forming as transfer image on an image receptor by using the apparatus.

6 Claims, 3 Drawing Sheets

FIG. 6

APPARATUS FOR IMAGE FORMATION AND METHOD OF IMAGE FORMATION

FIELD OF THE INVENTION

This invention relates to an apparatus and method of forming an image of a single color or overlapped multicolors by using a difference of adhesion between an exposed portion and a non-exposed portion in a photosensitive layer, and more specifically, it relates to an apparatus and method of forming an image in which a transfer matter very similar to printed matter can be obtained as a prepress proof, etc., for color proofing.

DESCRIPTION OF PRIOR ARTS

In the printing industry, prepress proofs have been used as means to check the finish, color tone, etc., of final printed matter before printing. Prepress proofs are obtained by an overlay method or by a surprint method, and selection among these methods depends on purpose.

In the overlay method, transparent base films are used, and each of the base films is provided with a photosensitive layer for a separated color of an image and is subjected irradiation with active beam and development to form an image. Then, these base films are overlaid on one another with the registering of images of separated colors by the eyes, etc. The disadvantage of this method is that an obtained image is affected by light reflected from overlaid films and differs from the texture of actual printed matter to a great extent.

The surprint method is disclosed, e.g., in U.S. Pat. Nos. 3,060,023, 3,060,024, 3,060,025 and 3,060,026, in which a plurality of images formed on the photosensitive layers according to images of separated colors are transferred to a single image receptor one after another to form a prepress proof. Each of the photosensitive layers may be colored with a color equivalent to the separated color of an image, or a transferred image may be colored with corresponding powder color toners.

U.S. Pat. Nos. 3,060,023 and 3,060,026 disclose a transfer method in which a photosensitive layer and an image receptor are brought into flat contact under pressure and are heated, and then these two members are separated. Further, these U.S. patents also disclose a method in which a photosensitive layer and an image receptor are heated between rollers to transfer an image. However, the problem of the methods of bringing a photosensitive layer and an image receptor into contact and then separating them is that they fail in stable image reproduction if the operational conditions such as separation speed, direction, etc., are not constant. That is, these methods have problems in that a transferred image shows nonuniformity in reflection density, very small periodic patterns and very small directionally repetitive patterns; markedly reduced accuracy in color reproduction, etc.

Japanese Laid-Open Patent Publications Nos. 97140/1984 and 188537/1986 disclose a proofing system applicable both to the overlay method and the surprint method. This system uses a color sheet obtained by laminating a separation layer, a color photosensitive layer and a protective film on a polyester substrate and an image-reception film obtained by laminating an image-reception layer and a protective film on a polyester substrate. The protective film of the color sheet and a half-tone negative are brought into flat contact and exposed to form an image, an nonexposed portions are dissolved out in a mixture solution of sodium carbonate, butylcellosolve and water. The color sheet, after dried, is usable for proofing in the overlay method. Due to the use of the mixture solution (developer), this system cannot be changed to a continuous one.

For proofing in the surprint method, the image of black formed on the color sheet is transferred to the image-reception film at a temperature of 110° C., under a pressure of 2 bars and at a rate of 60 cm/minute. Then, the image-reception film is registered with the eyes or by punching, and an image of cyan is then transferred thereto. This procedure is repeated in the order of magenta and yellow to give a color image. The obtained color image is transferred to an image receptor. A proofing sheet is completed by attaching a matted film to the image receptor to reduce gloss of the transfer image.

In the above method, an original image layer formed on a film is overlaid on the protective film of the color sheet such that the original image is in contact with the protective film, and these two members are exposed. After the exposure, the protective film is separated, and the color sheet is brought into contact under pressure with an image receptor to form an image. The resultant image is therefore facing reversely, and it has to be transferred once again to obtain its normal image. In this case, due to the presence of the protective film between the original image and the photosensitive layer, optical diffusion occurs, and it is difficult to obtain any image having high accuracy. Further, if an attempt is made to obtain a normal image in one transfer, it is necessary that a film having an original image has to be in contact with the protective film at an exposure time. However, this case shows defects that diffusion at an exposure time is large and image quality is degraded due to the existence of the film having the layer of the original image and the protective film between layer of the original image and the photosensitive layer.

Also well known is a simple proofing method which uses an image-forming material having a photosensitive layer and a letterpress printing proof press to transfer an image. That is, in this method, an image receptor is placed on a paper-bed of the printing proof press, an exposed color sheet is held on an impression cylinder and an image is transferred by rotating the impression cylinder.

In the exposure and transfer of any of the above methods, the exposure is carried out with an image-forming material and an original image fixed on a table etc., by using register pins, etc., and the exposed image-forming material is manually conveyed to a transferring device.

For color proof, formation of an image is repeated four times for four colors, and the registering and hue adjustment for the four colors are important to maintain image quality. It is conventional practice to carry out the registering, in general, by the eyes or pins with which to fix films with their holes. However, these methods are not sufficiently feasible for the formation of a color image in a short period of time. Namely, it is difficult or impossible to carry out the exposure and transfer steps continuously. And, since an image is manually transferred to an image receptor, the formation of an image depends on experience and sense of a skilled worker. Thus, it has not always been possible to obtain good images.

SUMMARY OF THE INVENTION

It is an object of this invention to provide an apparatus and method of forming an image, which can provide a prepress proof having a texture almost identical with that of printed matter and excellent fidelity in color reproduction in one transfer or a small volume of printed matter.

It is another object of this invention to provide an apparatus and method of forming an image, which makes it possible to carry out exposure and transfer uniformly and simply.

It is yet another object of this invention to provide an apparatus and method of forming an image, which can achieve continuous formation of a prepress proof, etc.

According to this invention there is provided an apparatus for forming an image, used for exposing an image-forming material comprised of a substrate, a photosensitive layer formed on one surface of the substrate and a protective layer on the photosensitive layer, separating the protective film from the image-forming material and transferring part or a whole, in the thickness direction, of nonexposed portions of the photosensitive layer to an image receptor; the apparatus having at least a light source for the exposure, an exposure cylinder and a second cylinder which can contact the exposure cylinder, the light source for the exposure being arranged outside the radius of the exposure cylinder, the exposure cylinder having means of attaching the image-forming material thereto, the second cylinder having means of receiving the image-forming material attached to the surface of the exposure cylinder and holding the received image-forming material.

According to this invention there is further provided a method of forming an image in an apparatus having at least a light source for exposure, an exposure cylinder and a second cylinder which is capable to contact the exposure cylinder, the method comprising attaching an image-forming material to the exposure cylinder with its protective film on the exposure cylinder side, exposing the image-forming material, introducing the exposed image-forming material into the nip formed between the exposure cylinder and the second cylinder by means of rotation of the exposure cylinder, allowing the second cylinder to hold the image-forming material having the protective film or having no protective film, and, after removal of the protective film if it is existent, bringing the photosensitive layer of the image-forming material and an image receptor into face-to-face contact under pressure to transfer an image formed on the photosensitive layer of the image-forming material to the image receptor.

The above contact under pressure may be carried out by introducing the image-forming material and the image receptor into the nip formed between the exposure cylinder and the second cylinder or by introducing these two members into the nip formed between the second cylinder and a third cylinder which is positioned so as to contact the second cylinder freely.

In this invention, the method of forming an image may use the above third cylinder as a common transfer cylinder with a plurality of sets of exposure and second cylinders arranged in its circumference, and comprises carrying out the procedure of bringing an image formed on the exposed photosensitive layer into contact under pressure with the receptor attached to the common transfer cylinder to transfer the image and continuously carrying out the above procedure with regard to the other sets of the exposure and second cylinders.

DETAILED DESCRIPTION OF THE INVENTION

In this invention, various image-forming materials such as materials for a dry method using separation development to form an image and other materials are usable as an image-forming material. In particular, materials for a dry method using separation development are preferably usable since they can achieve simple and continuous procedure of image formation.

Any light sources for the exposure such as a U.V. lamp, etc., may be used if they are capable of curing that portion of a photosensitive layer which corresponds to a non-image portion.

Concerning the second cylinder (to be referred to as "pressure cylinder" hereinbelow), it is preferable to mount the pressure cylinder such that it can freely contact the exposure cylinder and that the nip pressure between the exposure cylinder and the pressure cylinder is adjustable. In order to carry out the transfer of an image formed on a photosensitive layer to an image receptor smoothly, the pressure cylinder is preferably covered with an elastic material such as a rubber, etc.

As means of attaching an image-forming material, any means are usable if they can fix the material on the surface of the cylinder. For example, they are means of sucking and fixing the material in which the material-attaching portion of the exposure cylinder is provided with many holes and grooves for vacuum, fixing means using static electricity, fixing means using a duplicated adhesive tape, fixing means using a clamp bar mounted along the axial direction of the exposure cylinder, and other means such as a gripper used in pressure and intermediate cylinders of a printing machine. However, it is necessary that the means of attaching an image-forming material is constituted so as to release the material when the holding means of the pressure cylinder holds the material having a protective film or having no protective film in the nip or gap (to be referred to as "nip" hereinbelow) formed between the exposure cylinder and the pressure cylinder. And, the clamp bar or the like as material-attaching means is mounted preferably in a position within the radius of the cylinder, since it gives no damage on the cylinder surface. Further, it is preferable that the material-attaching means has a pin bar, etc., in order to achieve accurate registering by adjusting the position of an image-forming material both on the exposure cylinder and the pressure cylinder. As means of holding an image-forming material, which is mounted on the pressure cylinder, any holding means such as means of sucking and fixing an image-forming material, in which a portion to hold an image-forming material is provided with many holes, etc., fixing means using a duplicated adhesive tape, etc., and the like may be used if they are capable of fixing an image-forming material on the pressure cylinder. More preferable is the use of a gripper in order to move an image-forming material from the exposure cylinder to the pressure cylinder smoothly. It is also possible to use a gripper and suction means, an adhesive tape or electrostatic means as attaching means and a gripper as holding means. Further, a plurality of rolls having a small diameter may be mounted in the vicinity of the outer circumference of the exposure cylinder and/or the pressure cylinder, and an image-forming material and/or an image receptor are brought into close contact with the cylinder surface in order to prevent occurrance of wrinkles.

In order to retain a protective film on the exposure cylinder and hold an image-forming material having no protective film on the pressure cylinder, in the place ahead from the exit of the nip formed between the exposure and the pressure cylinders, or in order to ease separation of the protective film on the pressure cylinder, it is preferable to select a protective film, a quality of a substrate and a material for a photosensitive layer suitably such that the adhesion strength between the photosensitive layer and the protective film is lower than that between the photosensitive layer and the substrate. The surface of the protective film may be subjected to release treatment. The protective film may have a cut in the axial direction of the exposure cylinder in the portion near its leading end such that the remaining portion of the protective film remains attached to the exposure cylinder when the holding means of the pressure cylinder, e.g. a gripper, grips it. Or, the protective film may have a cut in the axial direction of the pressure cylinder in the portion near to its leading end so that the protective film is gripped by the holding means of the pressure cylinder, e.g. a gripper, then the gripper moves inside the pressure cylinder, the end of the remaining portion of the protective film therefore floats, the end portion is fixed manually or by detention means, e.g. a roller, mounted in the vicinity of the outer circumference of the pressure cylinder, and the protective film is separated as the roller rotates or the pressure cylinder rotates.

When an image-forming material having a protective film is moved to the pressure cylinder side, the protective film may be cut in the portion near its leading end to separate the remaining portion of the protective film by the above roller, etc. A rourette can be also used to float the end of the protective film and separate it manually or by the above roller.

The apparatus for forming an image in this invention may have a constitution in which the exposure cylinder is further provided with means of attaching an image receptor, and an image-exposed photosensitive layer on the pressure cylinder is transferred to an image receptor attached to said means.

Further, the apparatus for forming an image in this invention may further have a transfer cylinder which has means of attaching an image receptor and which is in contact with the pressure cylinder, and an image-exposed photosensitive layer on the pressure cylinder is transferred to an image receptor attached to the transfer cylinder. It is preferable that the transfer cylinder is mounted so that it contacts the pressure cylinder freely and that the nip pressure between the pressure cylinder and the transfer cylinder is adjustable.

Figure 6:
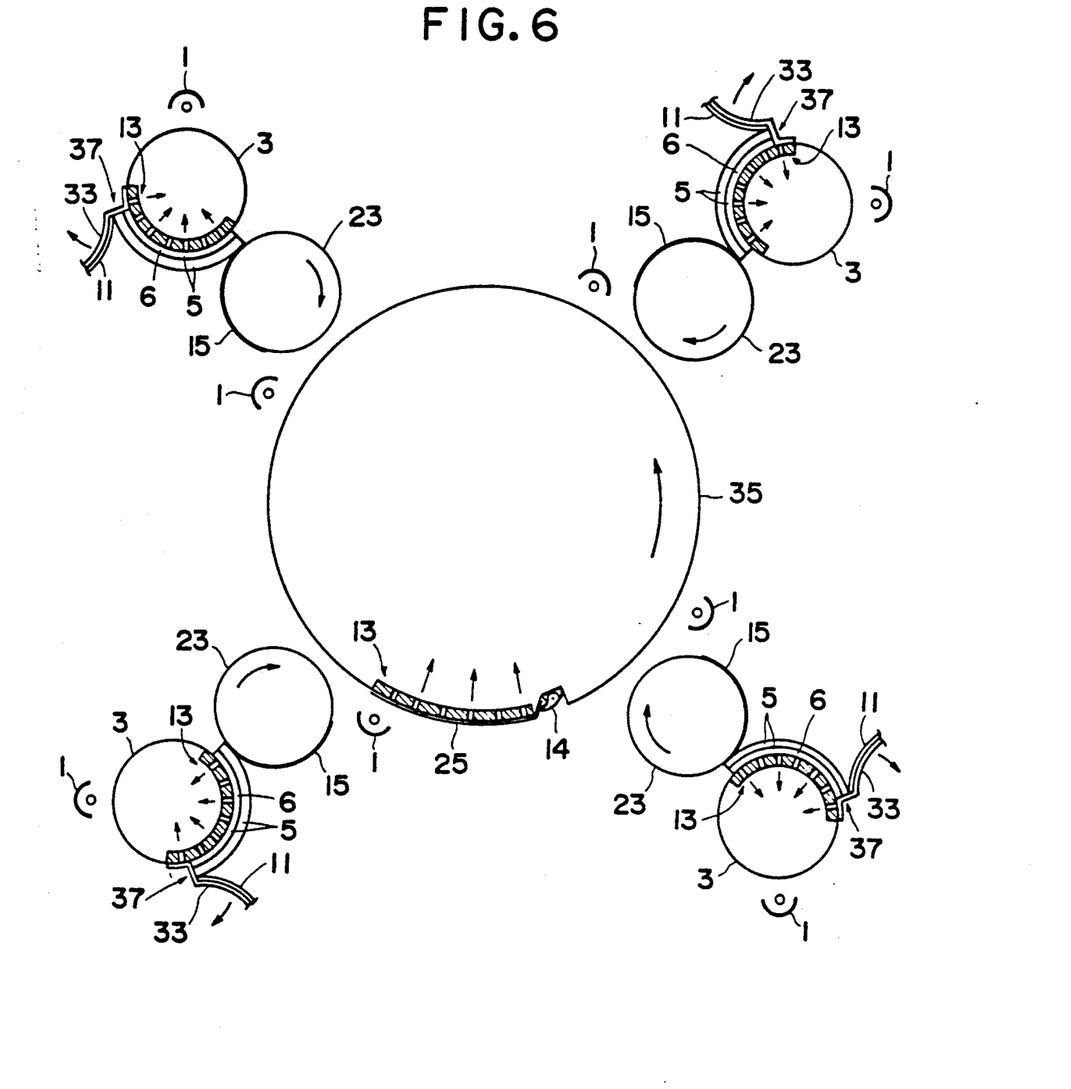
FIG. 6 is a schematic side view of another embodiment of the image-forming apparatus of this invention in which a third cylinder is a common transfer cylinder.

The apparatus for forming an image in this invention may have a constitution in which the transfer cylinder having means of attaching an image receptor is a common transfer cylinder, at least two pressure cylinders each of which can contact the common transfer cylinder are arranged beside the common transfer cylinder, and the exposure cylinder is disposed such that it can contact the pressure cylinder. A light source for the exposure is arranged beside the exposure cylinder. Preferably, a light source for the post-exposure of an image-forming material is placed in a position around the common transfer cylinder and on the side of the exit of the nip formed between the pressure cylinder and the common transfer cylinder as shown in FIG. 6. The number of each of the pressure cylinders and light sources for post-exposure may be two for prepress proofs and printed matter of two colors. For prepress proofs and printed matter of multi-colors, such as three or four colors, it is preferable that the number of each of these two members disposed beside the common transfer cylinder corresponds to the number of colors. The common transfer cylinder has a larger diameter than the pressure cylinders.

The exposure cylinder or the transfer cylinder may have heating means in its portion to which an image-forming material is attached, thereby to heat the image-forming material to a suitable temperature. Then, the transfer of an exposed photosensitive layer to an image receptor is smoothly carried out, the transfer rate is improved and fidelity in reproduction for fine images is improved. In general, the cylinder has a surface temperature, in a portion to which an image receptor is attached, of between 50° C. and 150° C., preferably between 60° C. and 110° C.

This invention will be explained hereinbelow according to drawings.

Figure 1:
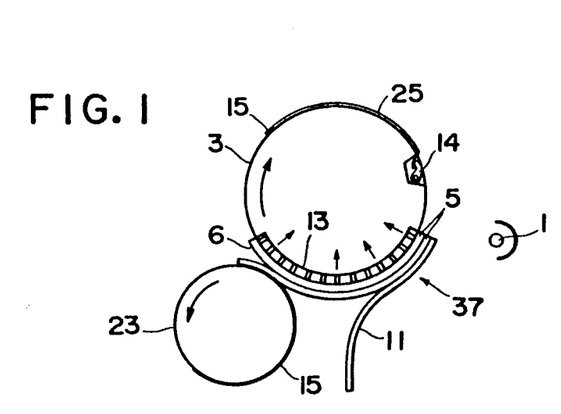
FIG. 1 is a schematic side view of an apparatus for forming an image in this invention, which comprises an exposure cylinder and a second cylinder (pressure cylinder).

FIG. 1 is a schematic side view of an apparatus for forming an image in this invention, in which a light source for exposure, an exposure cylinder and a pressure cylinder are present, and a protective film remains on the exposure cylinder side.

A U.V. lamp 1 is disposed radially outside an exposure cylinder 3, and a laminate 37 of an image-forming material 5 and an original image 11 is exposed thereto. The original image may be a single positive or negative film when an image of a single color is formed. To form an image of multicolors, positive or negative films having a separated color are used.

It is not always necessary to laminate the original film on the image-forming material, and the image-exposure of the image-forming material may be carried out by transmitting image-analysis information thereto by using a laser, etc.

The exposure cylinder is provide with suction means 13 for sucking an image-forming material and a gripper 14 for attachment of an image receptor. The suction means has many holes in the portion to which an image-forming material is to be attached, and has the laminate attached by suction. After separation of the original image 11 from the exposed laminate 37, the exposure cylinder is rotated to direct the image-forming material 5 into the nip formed between the exposure cylinder 3 and a pressure cylinder 23. The laminate may be conveyed onto the pressure cylinder without separating the original image.

The pressure cylinder 23 has a duplicated adhesive tape 15 in the portion to which an image-forming material is to be attached, and holds the image-forming material directed into the nip portion, and a protective film 6 is separated and still retained on the surface of the exposure cylinder. The image-forming material held on the pressure cylinder without the protective film is directed into the nip portion formed between the pressure cylinder and the exposure cylinder by further rotating the pressure cylinder, and brought into contact under pressure with an image receptor 25 attached to the exposure cylinder by using a gripper 14 and the duplicate adhesive tape 15 disposed on the exposure cylinder, thereby to transfer an image formed on the photosensitive layer of the image-forming material into the image receptor. The image receptor may be attached by using the suction means 13, i.e., means for attachment of an image forming material. It is preferable that the contact of the pressure cylinder with the exposure cylinder is released after the transfer. Preferably, the exposure cylinder has heating means (not shown) in the portion to which an image-receptor is attached. The exposure cylinder is further rotated for post-exposure of the transferred image to a U.V. lamp.

Figure 2:
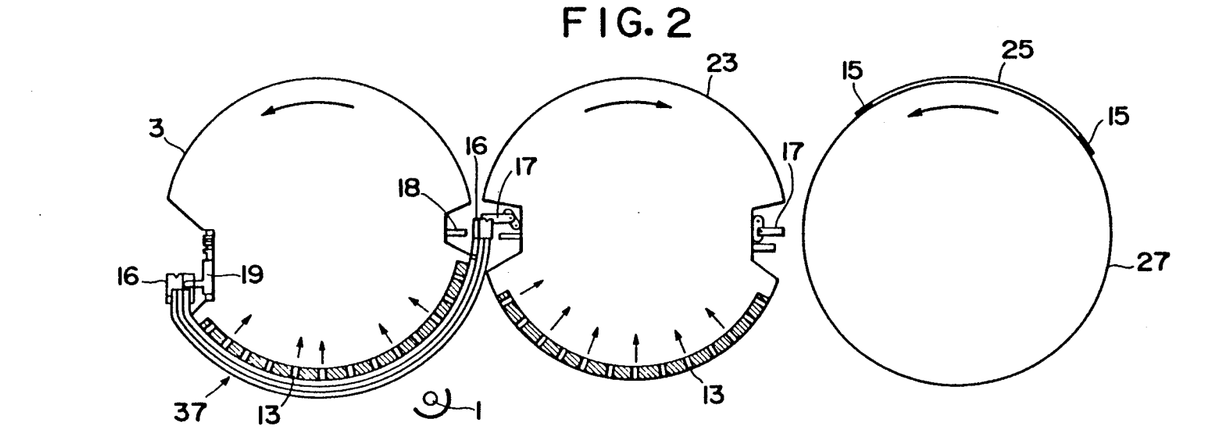
FIG. 2 is a schematic side view of an apparatus for forming an image in this invention, which comprises an exposure cylinder, a second cylinder and a third cylinder (transfer cylinder).

FIG. 2 is a schematic side view of another embodiment of the apparatus for forming an image in this invention, which comprises a light source for exposure, an exposure cylinder, pressure cylinder and transfer cylinder.

An exposure cylinder 3 positioned in the leading end potion of a laminate 37 composed of an image-forming material and an original image is provided with a gripper 18 to grip the laminate in the concave portion on its surface and with suction means 13 in the portion to which an image-forming material is to be attached. The suction means may exert its suction force on part of the laminate. The laminate 37 of an image-forming material and an original image is attached to the surface of the exposure cylinder by means of the gripper and suction means. A clamp bar 16, which clamps the laminate with a magnetic power, is formed in the leading end portion of the laminate, and the gripper 18 grips the clamp bar 16. The exposure cylinder also has a clamp bar 16, which exerts tension in the direction of the trailing end of the laminate, and a gripper 19 in the concave portion on its surface, and the clamp bar 16 and the gripper 19 grip the laminate and bring the laminate into close contact with the surface of the exposure cylinder. The laminate is exposed to a U.V. lamp 1 disposed radially outside the exposure cylinder 3. After the exposure, the laminate is directed to the nip formed between the exposure cylinder and the pressure cylinder by rotating the exposure cylinder.

By mutual action between a gripper 17 formed in the concave surface concave of the pressure cylinder and the gripper 18 formed in the exposure cylinder, the laminate is conveyed from the surface of the exposure cylinder to the pressure cylinder side. In this case, a protective film has a cut in the axial direction of the exposure cylinder in the vicinity of the leading end thereof, whereby only the leading end of the protective film is conveyed to the pressure cylinder side, and the remaining portion of the protective film remains attached on the exposure cylinder side. The pressure cylinder is provided with suction means of holding the image-forming material having no protective film thereby to bring the image-forming material into close contact with the surface of the pressure cylinder, and at the same time a gripper 17 formed in the concave portion of the pressure cylinder surface in the trailing end of the image-forming material grips the clamp bar 16 in the trailing end of the image-forming material to hold the image-forming material having no protective film on the pressure cylinder. The image-forming material conveyed onto the pressure cylinder is directed to the nip formed between the pressure cylinder and a third cylinder 27 (to be referred to as "transfer cylinder" hereinbelow).

In FIG. 2, the original image may be separated when the laminate is still on the exposure cylinder by arranging the attaching means of the exposure cylinder and the holding means of the pressure cylinder as shown in FIG. 1.

Attached to the transfer cylinder 27 is an image receptor 25 by means of a duplicated adhesive tape 15, etc., attached to the position to which the image-forming material is to be attached, thereby to bring an image formed in the photosensitive layer of the image-forming material into close contact with the image receptor. Preferably, there is a U.V. lamp (not shown) radially outside the transfer cylinder in order to carry out the postexposure of the image closely attached to the image receptor.

Figure 3:
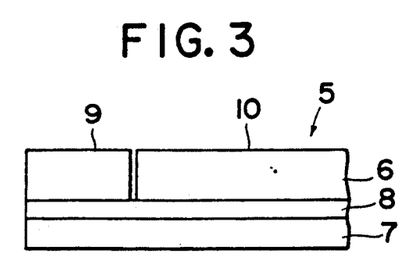
FIGS. 3 and 4 are schematic side views showing states of an image-forming material in which the protective film has a cut in the portion near to the end.

FIG. 3 shows a schematic side view of an image-forming material 5 comprising a substrate 7, a photosensitive layer 8 and a protective film 6, in which the protective film 6 has a cut in the terminal portion 9, and the terminal portion to be gripped by a clamp bar and the remaining portion of the protective film are cut apart or separated. Due to the cut, the terminal portion of the protective film is conveyed to the pressure cylinder, and the remaining protective film remains attached to the exposure cylinder. In this case, it is preferable that the protective film on the photosensitive layer side has been treated for release.

Figure 4:
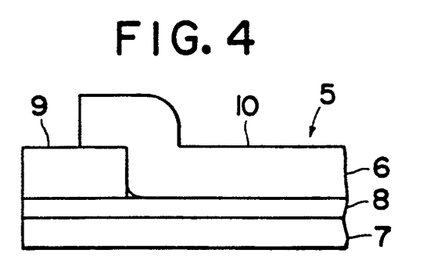

FIG. 4 shows a state in which the protective film 6 is cut in the terminal portion 9 and the remaining portion of the protective film is overlaid on the terminal portion. Consequently, only the terminal portion is conveyed to the pressure cylinder while being held by the clamp bar, and the remaining portion of the protective film remains attached to the exposure cylinder.

Figure 5:
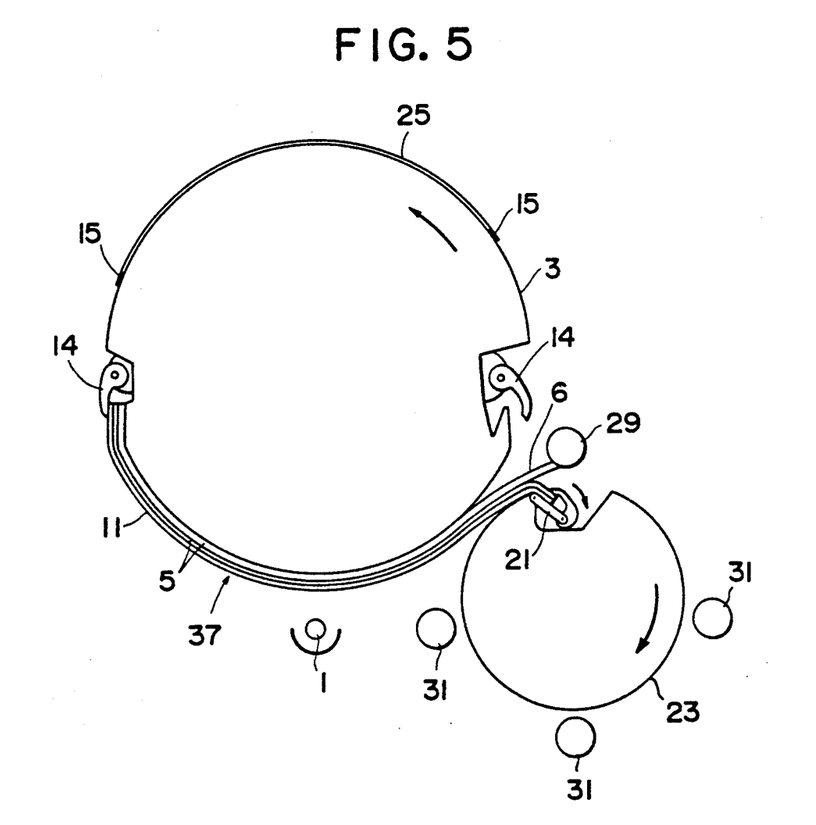
FIG. 5 is a schematic side view of another embodiment of the image-forming apparatus of this invention which comprises an exposure cylinder and a second cylinder.

FIG. 5 is a schematic side view of another embodiment of the apparatus for forming an image in this invention, in which the apparatus comprises a light source for exposure, an exposure cylinder and a pressure cylinder, and a protective film is separated on the pressure cylinder side.

A U.V. lamp 1 is disposed radially outside an exposure cylinder 3, and a laminate 37 composed of an image-forming material 5 and an original image 11 is exposed to the U.V. lamp.

The exposure cylinder is provided with a gripper 14 for the attachment of the image-forming material in the concave portion and with an adhesive tape 15 for the attachment of the image-forming material. The gripper 14 may be selected from those generally used in pressure and intermediate cylinders of a printine maching to shift a grip.

The exposure cylinder 3 is rotated to introduce the laminate of the image-forming material 5 and the original image 11 into the nip formed between the exposure cylinder 3 and a pressure cylinder 23. It is also possible to separate the original image from the laminate after exposure and introduce the image-forming material into the nip by arranging the attaching means and holding means as shown in FIG. 1.

The pressure cylinder 23 is provided with a gripper 21 having an arm in a surface portion in which to hold the image-forming material, and the gripper 21 is to hold the introduced image-forming material. A protective film 6 has a cut in the vicinity of its leading end portion on the pressure cylinder as shown in FIG. 3 or 4. When the gripper 21 holds the image-forming material including the terminal portion of the protective film a and the arm swings to turn the gripper, then, the protective film is separated by holding the remaining terminal portion of the protective film. The separated protective film is taken by a take-up roller 29. On the surface of the pressure cylinder, the gripper 21 having the arm and a hold roll 31 hold the image-forming material from which the protective film is separated.

The image-forming material held on the surface of the pressure cylinder and having a photosensitive layer on its surface is introduced to the nip formed between the pressure cylinder and the exposure cylinder by rotating the pressure cylinder, and brought into contact, under pressure, with an image receptor 25 attached to the exposure cylinder with an adhesive tape provided to the exposure cylinder, to transfer an image formed on the photosensitive layer to the image receptor. After the transfer, it is preferable to release the pressure cylinder from the contact to the exposure cylinder. It is also preferable that the exposure cylinder is provided with heating means (not shown) in the portion to which the image receptor is attached. It is further preferable to turn the exposure cylinder to carry out the post-exposure of the transferred image.

FIG. 6 is a schematic side view of another embodiment of the apparatus for forming an image in this invention, which comprises a light source for exposure, an exposure cylinder, a pressure cylinder and a common transfer cylinder.

A U.V. lamp 1 is arranged outside the radius of the an exposure cylinder 3. A laminate 37 composed of an image-forming material 5 and an original image 11, laminated in this order, is laid on the exposure cylinder such that the protective film is on the exposure cylinder side, and exposed to the U.V. lamp 1.

The exposure cylinder 3 is provided with suction means of holding the laminate 37. The suction means stands for many holes formed in the portion of the exposure cylinder to which the image-forming material is to be attached, and holds the image-forming material by suction. The area of the image-forming material 5 may be smaller than that of the original image 11 so that suction may be exerted on the original image. In this embodiment, the original image 11 is brought into intimate contact with the image-forming material by using a top sheet 33, which is square-shaped, larger-sized, empty in the middle portion and held by suction, on the laminate 37. The suction means may be divided into a plurality of groups, and each group may be worked independently.

The original image 11 and the top sheet 33 are separated from the exposed laminate 37, and then the exposure cylinder 3 is turned to introduce the image-forming material into the nip formed between the exposure cylinder 3 and a pressure cylinder 23. Grip-shifting means such as a gripper, etc., may be used to convey the laminate onto the pressure cylinder without separating the original image from the laminate. After the image-forming material is conveyed onto the pressure cylinder, it is preferable to release the exposure cylinder from its contact to the pressure cylinder.

The image-forming material introduced is attached to the pressure cylinder 23 with a duplicated adhesive tape 25 provided to the portion of the surface of the pressure cylinder to which the image-forming material is to be attached, and the protective film 6 is separated on the pressure cylinder. The protective film 6 may be retained on the surface of the exposure cylinder.

The image-forming material from which the protective film is separated and which is attached to the surface of the pressure cylinder is introduced in the nip formed between the pressure cylinder and the common transfer cylinder by rotating the pressure cylinder, and brought into contact under pressure with an image receptor 25 held on the common transfer cylinder with a gripper 14 formed in the concave portion of the common transfer cylinder and suction means 13, to transfer an image formed in the photosensitive layer into the image receptor. The image receptor 25 may be attached by using a duplicated adhesive tape. It is preferable to release the pressure cylinder from its contact to the common transfer cylinder after the transfer. It is also preferable that the common transfer cylinder is provided with heating means (not shown) in the portion where the image receptor is to be attached. The common transfer cylinder is further turned to carry out the post-exposure of the transferred image to the U.V. lamp 1. When the above procedure is repeated by using other exposure cylinders and pressure cylinders arranged around the common transfer cylinder, then a color prepress proof or color printed matter can be obtained.

In this invention, the image receptor can be selected from art paper, coated paper, wood free paper, films, and the like.

In this invention, the original image is a film processed for a single color (image mask) or an image mask obtained by fixing a shade paper to a transparent polyethylene terephthalate film having functions of color separation, etc., when it is used for a single color prepress proof or printed matter, and a color-separated image mask is used for a multi-color proof or printed matter.

The image-forming material for this invention comprises a substrate, a photosensitive layer formed on one surface of the substrate and a protective film.

As the substrate, suitably usable are materials which are stable against heat, chemicals, lights, etc., and which are permeable to active beams, e.g. a film or sheet of cellulose acetate, polystyrene, polyvinyl chloride, polyethylene terephthalate, polycarbonate, polyimide or polypropylene. In particular, a polyethylene terephthalate film or sheet is excellent in transparency, thermal stability and dimensional stability, and preferable.

The above substrates may be used without any modification, or treated for release with a suitable oil-repellent substance such as silicon resin, fluorine resin, etc.

The photosensitive layer has a constitution of: (a) a photopolymerizable compound and coloring agent, (b) a photopolymerizable compound, thermoplastic resin and coloring agent, or the like.

A photopolymerization initiator, an inhibitor of thermal polymerization, etc., may be further used in combination.

As the photopolymerizable compound, at least one selected from monomer, oligomer and prepolymer is used. Preferably usable is a compound which can plasticize the thermoplastic resin at room temperature.

As the thermoplastic resin (organic polymer binder), usable are polymers which are thermoplastic, excellent in compatibility with the photopolymerizable compound and devoid of photopolymerization ability.

Known dyes and/or pigments are usable as dyes and/or pigments in the photosensitive layer. In general, dyes and/or pigments having hues of yellow, magenta, cyan and black are desirable, and metallic powders, white pigments, fluorescent pigments are also usable as well.

The photosensitive layer has a film thickness of about 0.5 $\mu$m to 5 $\mu$m. The suitably applied amount therefor depends on dyes and/or pigments, and is suitably in the range of from 0.5 g/m$^2$ to 10 g/m$^2$.

As the protective film, it is possible to cite a polyethylene film, polyethylene terephthalate film and acetate film. When a polyethylene film is used as a protective film, releasability of the polyethylene film may be utilized, or a releasing agent, e.g. silicon resin may be applied on the protective film.

In the method of forming an image in this invention, the transfer of an image to the image receptor may be carried out by introduction to the nip formed between an exposure cylinder to which the image receptor is attached and a pressure cylinder.

Further, in the method of forming an image in this invention, the transfer of an image to the image receptor may be carried out by introduction to the nip formed between a transfer cylinder to which the image receptor is attached and a pressure cylinder.

Accordingly to this invention, particularly in a surprint method using printing paper, it is possible to provide color proof sheets having a texture identical with printed matter simply, swiftly and stably.

This invention is applicable not only to an overlay method but also to small volume printing up to about some hundreds of copies.

This invention gives transfer images having excellent quality, gives a normal image in one transfer, makes it possible to carry out exposure and transfer continuously, and makes it easy to carry out registering. Therefore, this invention produces a remarkable effect that stable images can be obtained without counting on skilled workers' experience and special sense.

In most of image-forming materials comprising a substrate, photosensitive layer and protective film, the protective film has a larger thickness and a poorer permeability to light than the substrate.

In this invention, since the exposure is carried out from the substrate side, optical diffusion and scattering are therefore small, and it is therefore possible to provide excellent prepress proof or printed matter.

In this invention, since the image-forming material and image receptor can be attached to an exposure cylinder, it is relatively easy to carry out registering, and it is therefore possible to provide prepress proof or printed matter free from register failure.

In this invention, since pressure and exposure cylinders are arranged in the circumferential area of a common transfer cylinder and each of colors are transferred nearly at the same time, it is relatively easy to carry out registering, and it is therefore possible to provide color proof or printed matter free from registering failure.

This invention will be explained hereinbelow according to Examples, in which "part" stands for "part by weight" and "%" stands for "% by weight".

EXAMPLE 1

A liquid for a photosensitive layer having the following composition was prepared.

Diallylisophthalate prepolymer (Daiso Isodap Mn 45000, trade name, made by Toyo Soda Co., Ltd.): 21.23 parts
Dipentaerythritolhexaacrylate (DPHA, trade name, made by Nippon Kayaku K. K.): 7.08 parts
Photopolymerization initiator, benzophenone: 0.5 part.
4,4 bis-Diethylaminobenzophenone (EAB, trade name, made by Hodogaya Chemical Co., Ltd.): 0.17 part
Hydroquinone: 0.001 part
Carbon black (MA-7, tradename, made by Mitsubishi Chemical Ind., Ltd.): 5.0 parts
Toluene: 38.0 parts
Methyl ethyl ketone: 40.0 parts The above liquid was applied on a biaxially oriented polyethylene terephthalate film (having a thickness of 12 $\mu$m) such that its dried thickness was 2.4 $\mu$m. Then, a polyethylene film (as a protective film) was attached onto the coated surface thereof to give an image-forming material.

The image-forming material, a positive film and a sheet of art paper were respectively attached onto the exposure cylinder of an apparatus shown in FIG. 1, and exposure and transfer were carried out. The positive film was manually separated after the exposure.

The protective film was smoothly separated from the image-forming material, and the resultant image was clear.

In addition, the rate of feeding the image-forming material and the art paper sheet to the nip portion was 50 cm/minute, the linear pressure was 7 kgf/cm, and the exposure cylinder had a surface temperature, on the art paper side, of 100° C.

EXAMPLE 2

The procedure for the preparation of the liquid for a photosensitive layer in Example 1 was repeated to prepare three liquids for a photosensitive layer except that Lionol yellow FG1310 (trade name, made by Toyo Ink Manufacturing Co., Ltd.), Carmine 7BFG (trade name, made by Toyo Ink Manufacturing Co. Ltd.) and Lionol Blue FG7330 (trade name, made by Toyo Ink Manufacturing Co., Ltd.) were used in place of the carbon black in Example 1.

The liquids were respectively applied on polyethylene terephthalate films in the same way as in Example 1, and a polyethylene film was attached to each of the coated surfaces to give image-forming materials. At first, a color-separated positive film corresponding to Lionol Yellow FG1310 was laminated on the image-forming material, and the laminate was exposed by using the apparatus shown in FIG. 1 and laid on the transfer image obtained in Example 1 to carry out transfer. Then, the above procedure was also repeated with regard to the remaining colors to prepare a color proof in which a dot image was formed in the order of black, yellow, cyan and magenta.

The resultant color proof was clear.

EXAMPLE 3

The same image-forming material as that of Example 1 and a positive film were attached onto the exposure cylinder of an apparatus shown in FIG. 5 with the protective film of the material on the exposure cylinder side, and an art paper sheet was also attached on the exposure cylinder. Then exposure and transfer were carried out. The protective film having a cut in the terminal portion was used. The terminal portion floated with an action of a gripper 21 with an arm was attached to a take-up roller 29, and the take-up roller was turned to separate the protective film from the image-forming material.

The resultant transfer image was clear.

In addition, the rate of feeding the image-forming material and the art paper sheet into the nip as 50 cm/minute, the linear pressure was 7 kgf/cm, and the surface temperature of the exposure cylinder on the art paper side was 100° C.

EXAMPLE 4

The procedure of Example 3 was repeated to prepare a color proof except that the same image-forming material as that of Example 2 was used and that transfer was carried out on the transfer image obtained in Example 3 in the order of black, cyan, magenta and yellow.

The resultant color proof was clear.

EXAMPLE 5

The same image-forming materials as those of Example 1 and 2 and color-separated positive films corresponding to black, cyan, magenta and yellow were attached to the exposure cylinders of an apparatus shown in FIG. 6, and transfer was carried out in the order of black, cyan, magenta and yellow. The exposed positive films were separated on the exposure cylinders. Each of the protective films was separated from the image-forming material in the nip formed between the exposure cylinder and the pressure cylinder. The resultant transfer image was clear.

In addition, the rate of feeding the image-forming material and the art paper sheet into the nip in each case was 50 cm/minute, the linear pressure was 7 kgf/cm, and the surface temperature of each of the exposure cylinders on the art paper side was 100° C.

What is claimed is:

1. An apparatus for forming an image by exposing an image-forming material comprised of a substrate, a photosensitive layer formed on one surface of said substrate and a protective layer on said photosensitive layer, separating said protective layer from the image-forming material and transferring part or a whole, in the thickness direction, of nonexposed portions of said photosensitive layer to an image receptor; the apparatus comprising at least a light source fort the exposure, an exposure cylinder and a second cylinder which can contact the exposure cylinder, said light source fort the exposure being arranged outside the radius of said exposure cylinder, said exposure cylinder having means for attaching said image-forming material thereto, said second cylinder having means for receiving said image-forming material attached to the surface of said exposure cylinder and holding said received image-forming material.

2. An apparatus according to claim 1 wherein said exposure cylinder has means for attaching said image receptor thereto in addition to means for attaching said image-forming material.

3. An apparatus according to claim 1 wherein means for attaching an image-forming material to said exposure cylinder maintains said protective layer separated from said exposed image-forming material as it is attached to said exposure cylinder.

4. An apparatus according to claim 1, which further has means for separating a portion of said protective layer in the vicinity of the surface of said second cylinder, said protective layer having a cut in the vicinity of the leading end portion, said means being for separating that portion of said protective layer which is other than its leading end portion from said exposed image-forming material.

5. An apparatus according to claim 1, which further has a third cylinder outside the radius of said second cylinder, said third cylinder being able to contact said second cylinder and having means for attaching an image receptor.

6. An apparatus according to claim 5 which has a common transfer cylinder, as the third cylinder, having means for attaching an image receptor, and at least two pressure cylinders, as said second cylinder, being arranged outside the radius of said common transfer cylinder and being able to contact said common transfer cylinder, and in which said exposure cylinder having means for attaching said pressure cylinder, and said light source for the exposure of said image-forming material is arranged outside the radius of said exposure cylinder.

* * * * *